United States Patent
Kuo et al.

(10) Patent No.: US 7,180,173 B2
(45) Date of Patent: Feb. 20, 2007

(54) HEAT SPREADER BALL GRID ARRAY (HSBGA) DESIGN FOR LOW-K INTEGRATED CIRCUITS (IC)

(75) Inventors: Yian-Liang Kuo, Hsinchu (TW); Yung-Sheng Huang, Hsin-Chu (TW); Yu-Ting Lin, Hsin-Chu (TW)

(73) Assignee: Taiwan Semiconductor Manufacturing Co. Ltd., Shinchu (TW)

( * ) Notice: Subject to any disclaimer, the term of this patent is extended or adjusted under 35 U.S.C. 154(b) by 0 days.

(21) Appl. No.: 10/718,192

(22) Filed: Nov. 20, 2003

(65) Prior Publication Data

US 2005/0110140 A1    May 26, 2005

(51) Int. Cl.
*H01L 23/34* (2006.01)
*H01L 23/10* (2006.01)

(52) U.S. Cl. .............. 257/706; 257/720; 257/790; 257/704; 257/738; 438/122; 174/52.4

(58) Field of Classification Search ........... 257/738, 257/704, 717–720, 706, 723, E23.119, E23.087, 257/E23.101, 790, 632; 438/122, 118; 508/161; 174/52.4

See application file for complete search history.

(56) References Cited

U.S. PATENT DOCUMENTS

| | | | | |
|---|---|---|---|---|
| 4,711,804 A | * | 12/1987 | Burgess | 428/210 |
| 4,748,495 A | | 5/1988 | Kucharek | 357/82 |
| 5,175,612 A | * | 12/1992 | Long et al. | 257/667 |
| 5,223,741 A | | 6/1993 | Bechtel et al. | 257/678 |
| 5,311,060 A | * | 5/1994 | Rostoker et al. | 257/796 |
| 5,331,205 A | * | 7/1994 | Primeaux | 257/790 |
| 5,346,743 A | * | 9/1994 | Uchida et al. | 428/76 |
| 5,371,404 A | * | 12/1994 | Juskey et al. | 257/659 |
| 5,574,630 A | * | 11/1996 | Kresge et al. | 361/792 |
| 5,585,671 A | | 12/1996 | Nagesh et al. | 257/697 |
| 5,785,799 A | * | 7/1998 | Culnane et al. | 156/379.7 |

(Continued)

FOREIGN PATENT DOCUMENTS

CN    1397999    2/2003

(Continued)

OTHER PUBLICATIONS

Taiwan Patent Office Action.

(Continued)

*Primary Examiner*—Kenneth Parker
*Assistant Examiner*—Chris C. Chu
(74) *Attorney, Agent, or Firm*—Thomas, Kayden, Horstemeyer & Risley

(57) ABSTRACT

A method of forming a heat spreader ball grid array package, and the resultant heat spreader ball grid array package, comprising the following steps. A semiconductor chip affixed to a ball grid substrate is provided. The semiconductor chip over the ball grid substrate is encased with a molding compound. A heat spreader is mounted over the ball grid substrate and spaced apart from the molding compound to form a gap. Thermal grease is placed into the gap, at least between the heat spreader and the molding compound, to form the heat spreader ball grid array package. It is also possible to place thermal grease over the molding compound and then mounting the heat spreader over the ball grid substrate.

30 Claims, 2 Drawing Sheets

U.S. PATENT DOCUMENTS

| | | | |
|---|---|---|---|
| 5,917,702 A * | 6/1999 | Barrow | 361/704 |
| 5,969,947 A * | 10/1999 | Johnson et al. | 361/704 |
| 5,977,633 A | 11/1999 | Suzuki et al. | 257/739 |
| 6,309,908 B1 * | 10/2001 | Sarihan et al. | 438/106 |
| 6,362,530 B1 * | 3/2002 | Lee et al. | 257/778 |
| 6,376,907 B1 * | 4/2002 | Takano et al. | 257/704 |
| 6,462,410 B1 | 10/2002 | Novotny et al. | 257/707 |
| 6,492,724 B2 * | 12/2002 | Gaynes et al. | 257/707 |
| 6,610,635 B2 * | 8/2003 | Khatri | 508/161 |
| 6,737,755 B1 * | 5/2004 | McLellan et al. | 257/796 |
| 6,784,541 B2 * | 8/2004 | Eguchi et al. | 257/723 |
| 2001/0004131 A1 * | 6/2001 | Masayuki et al. | 257/720 |
| 2002/0079573 A1 | 6/2002 | Akram | 257/718 |
| 2003/0180484 A1 | 9/2003 | Imai et al. | |

FOREIGN PATENT DOCUMENTS

| | | | |
|---|---|---|---|
| JP | 61019154 A * | 1/1986 | |
| JP | 2003069263 | 3/2003 | |

OTHER PUBLICATIONS

Taiwan Office Action issued Apr. 19, 2006.
China Office Action mailed Dec. 1, 2006.

* cited by examiner

HEAT SPREADER BALL GRID ARRAY (HSBGA) DESIGN FOR LOW-K INTEGRATED CIRCUITS (IC)

FIELD OF THE INVENTION

The present invention relates generally to semiconductor chip packaging and more specifically to ball grid array (BGA) packages.

BACKGROUND OF THE INVENTION

Because of their capacity of high input-output (IO) number and high speed, ball grid array (BGA) packages have become the main stream of package types for advanced integrated circuit (IC) products. Such advanced IC products produce lots of heat which require the use of heat spreaders to form heat spreader ball grid array (HSBGA) packages in order to dissipate the extra heat. However, such HSBGA packages have higher thermal stresses while TC/TS tests and low dielectric constant (k) (LK) materials show weak robustness with the HSBGA packages cracking and delaminating, thus failing qualification tests. LK (low-k) is a dielectric material having a dielectric constant of less than about 3.9, the dielectric constant of silicon oxide ($SiO_2$), that is used to insulate adjacent metal lines (interlayer dielectric (ILD) or intermetal dielectric (IMD)) in advanced micro devices. Low-k material reduces capacitive coupling ("cross-talk") between lines. LK dies are dies with LK IMD (intermetal dielectric) layers, i.e. their IMD layers use LK dielectric materials.

TC is Temperature Cycling and a TC test is conducted to determine the resistance of a part to extremes of high and low temperatures, and to alternate exposures to these extremes. TS is Thermal Shock and the purpose of TS testing is to determine the ability of sold state devices to withstand exposure to extreme changes in temperature by thermally stressing the device. Thermal shock effects include cracking and delamination of substrates or wafers, opening of terminal seals or case seams and changes in electrical characteristics. If more than 30 cycles are performed, the test is considered to be destructive.

Flip-chip packages are not a cost-effective alternative as they cost about 10 times that of HSBGA packages.

U.S. Pat. No. 5,977,633 to Suzuki et al. describes a semiconductor device with metal base substrate having hollows.

U.S. Pat. No. 5,223,741 to Bechtel et al. describes a package for an integrated circuit structure.

U.S. Pat. No. 5,585,671 to Nagesh et al. describes a low thermal resistance package for high power flip chip ICS.

U.S. Pat. No. 6,462,410 B1 to Novotny et al. describes an integrated circuit component temperature gradient reducer.

U.S. Pat. No. 4,748,495 to Kucharek describes a high density multi-chip interconnection and cooling package.

SUMMARY OF THE INVENTION

Accordingly, it is an object of one or more embodiments of the present invention to provide an improved heat spreader ball grid array (HSBGA) design and a method of fabricating the same.

Other objects will appear hereinafter.

It has now been discovered that the above and other objects of the present invention may be accomplished in the following manner. Specifically, a semiconductor chip affixed to a ball grid substrate is provided. The semiconductor chip over the ball grid substrate is encased with a molding compound. A heat spreader is mounted over the ball grid substrate and spaced apart from the molding compound to form a gap. Thermal grease is placed into the gap, at least between the heat spreader and the molding compound, to form the heat spreader ball grid array package. It is also possible to place thermal grease over the molding compound and then mounting the heat spreader over the ball grid substrate. The invention also includes the heat spreader ball grid array package structure so formed.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1, 2B, and 3B schematically illustrate a second preferred embodiment of the present invention.

DETAILED DESCRIPTION OF THE PREFERRED EMBODIMENT

Information Known to the Inventors—Not Prior Art

The following is known to the inventors and is not to be considered as prior art to the instant invention.

Flip-chips do not have a failure problem when a heat spreader is used and the inventors have determined that this is because thermal grease is used as a buffer between the chip and the heat spreader to release stress caused by the introduction of the heat spreader.

Figure 1:
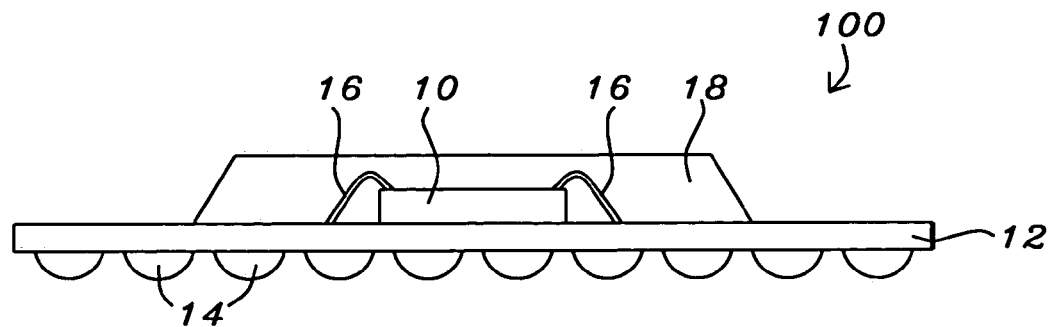
FIGS. 1, 2A, and 3A schematically illustrate a first preferred embodiment of the present invention.

Structure Common to Both Preferred Embodiments of the Present Invention—FIG. 1

FIG. 1 illustrates a ball grid array (BGA) chip 100 structure common to the first and second preferred embodiments of the present invention.

The ball grid array (BGA) chip 100 includes semiconductor chip 10 mounted onto a substrate 12 and is electrically connected to substrate 12 by, for example, lead wires 16. Substrate 12 includes balls 14 mounted on its surface opposite the silicon semiconductor chip 10.

Semiconductor chip 10 generally has a coefficient of thermal expansion (CTE) of about $3*10^{-6}/K$. Semiconductor chip/die 10 is preferably comprised of silicon (Si), germanium (Ge) or silicon germanium (SiGe) and is preferably silicon as will be used for purposes of illustration hereafter.

Semiconductor chip/die 10 generally has a coefficient of thermal expansion (CTE) of preferably from about $2.5*10^{-6}/K$ to $3.5*10^{-6}/K$ and more preferably about $2.8*10^{-6}/K$ when comprised of silicon and from about $5.5*10^{-6}/K$ to $6.5*10^{-6}/K$ and more preferably about $6.1*10^{-6}/K$ when comprised of germanium.

Balls 14 are preferably comprised of 63Sn37Pb (63% Sn+37% Pb— likely to be forbidden due to environmental protection), 96.5Sn3.5Ag (96.5% Sn+3.5% Ag— lead-free and expected to be used in the future due to environmental protection); 95.5Sn3.8Ag0.7Cu (95.5% Sn+3.8% Ag+0.7% Cu— lead-free) or 96.2Sn2.5Ag0.8Cu0.5Sb (96.2% Sn+2.5% Ag+0.8% Cu+0.5% Sb— lead-free) and are more preferably 63Sn37Pb for the present and 96.5Sn3.5Ag if 63Sn37Pb is banned.

Molding compound 18 encases silicon semiconductor chip 10 and lead wires 16. Molding compound 18 is preferably an epoxy molding compound comprised of:

a) Epoxy resin: preferably from about 10 to 20 weight %; function—binder, increases moldability, cure speed, melt viscosity and resistance to voiding; generates minimal paddle shift and wire sweep; controls level on ionic concentration; typical agents—Cresol-Novolac epoxy (high temperature) DGEBA;

b) Curing agent: preferably from about 5 to 15 weight %; function—increases moldability, improves electrical properties, increases heat and humidity resistance; typical agents—amines, phenols and acid anhydrides;

c) Catalyst: very low concentration and preferably about 1 weight %; function—enhances rate of polymerization to decrease in-mold cure time; typical agents—amines, imidazoles, organophosphines, ureas, Lewis acids and their organic salts (preferred);

d) Coupling agent: very low concentration and preferably less than about 2 weight %; function—promotes interfacial adhesion between matrix polymer and inorganic filler; improves heat and humidity resistance; increases or decreases viscosity of molding compound; typical agents—silanes, titanates, aluminum chelates and zircoaluminates;

e) Filler: preferably from about 50 to 75 weight %; function—provides lower TCE, increases thermal conductivity, improves electrical and mechanical properties, reduces resin bleed at parting line, reduces shrinkage; typical agents—ground fused silica (widely used), alumina;

f) Flame retardant: preferably from about 2 to 5 weight %; function—retards flammability; typical agents—brominated epoxies, antimony trioxide;

g) Mold-release agent: trace amounts; function—aids in release of package from mold; minimizes moisture ingress and corrosion; typical agents—silicones, hydrocarbon waxes, inorganic salts of organic acids;

h) Coloring agent: preferably about 5 weight %; function—reduces photonic activity, provides device visibility, aesthetics; typical agents—carbon black; and i) Stress-relief additive: preferably about 1 weight %; function—inhibits crack propagation, reduces crack initiation, lowers thermomechanical shrinkage; typical agents—silicones, acrylontrile-butadiene rubbers, polybutyl acrylate.

Molding compound 18 has a coefficient of thermal expansion (CTE) of preferably from about $5*10^{-6}$/K to $12*10^{-6}$/K or $15*10^{-6}$/k and more preferably about $7*10^{-6}$/K.

Figure 2A:
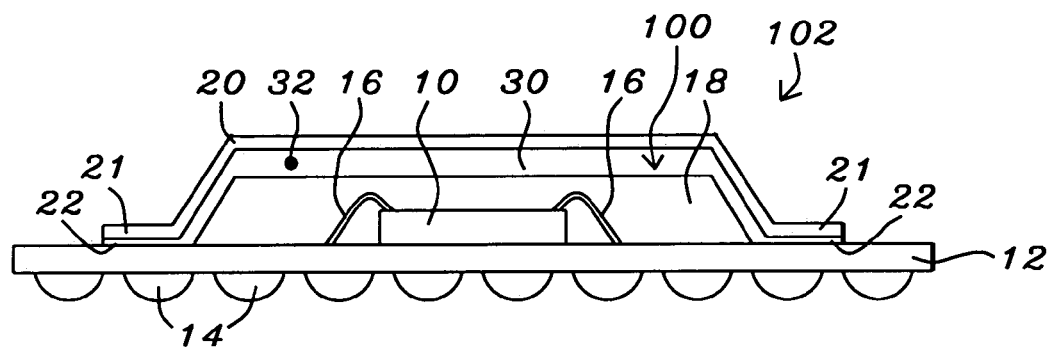

Formation of the First Preferred HSBGA Package 102 in Accordance with the Present Invention—FIG. 2A FIG. 2A illustrates the formation of the heat spreader ball grid array (HSBGA) package 102 in accordance with the first preferred embodiment of the present invention.

Heat spreader 20 is placed over and above BGA chip 100 leaving a resultant gap 30 between the molding compound 18 that encases the semiconductor chip 10 and the heat spreader 20. Heat spreader resembles an inverted square pie tin with an enlarged surrounding lip 21 which lip 21 is affixed to substrate 12 as by epoxy adhesive 22 as shown in FIG. 2A.

Heat spreader 20 is preferably comprised of copper (Cu), aluminum (Al), chromium (Cr) plated on Cu, Cr plated on Al, nickel (Ni) plated on Cu, Ni plated on Al, stainless steel or other like materials and is more preferably Cu. The coefficient of thermal expansion (CTE) of the heat spreader 26 is preferably from about $10*10^{-6}$/K to $25*10^{-6}$/K depending upon the materials and is more preferably about $17*10^{-6}$/K for copper (Cu).

Further processing may then proceed. For example, heat spreader 20 may then be mounted onto a PCB substrate or stiffener 200 using an adhesive 202, as shown in 3A.

In an important aspect of the present invention, thermal grease 32 is inserted into the gap 30 between the heat spreader 20 and the molding compound 18 to fill gap 30. Although the thermal grease 32 does not have to completely fill gap 30, the more completely the thermal grease does fill gap 30, the better the performance. It is preferably that a portion of gap 30 remains once the thermal grease 32 is inserted to allow for the thermal grease 32 to expand to release stress.

It is also noted that it is possible to place the thermal grease over the molding compound 18 and then mounting the heat spreader 24.

Thermal grease 32 (also called thermal interface materials) is preferably a grease (silicon rubber) containing heat-conducting particles such as zinc oxide, aluminum oxide, aluminum nitride, boron nitride or ceramic fillers or other materials which have the properties of heat conduction.

The thermal grease 32 is thermally conductive and serves as a thermally conductive interface between the heat spreader 20 having a CTE of about $17*10^{-6}$/K, for example, and the molding compound 18 having a CTE of about $7*10^{-6}$/K, for example. This greatly reduces the thermal stress otherwise inherent and has been found to reduce cracking and delamination by up to from about 50 to 90% (depending upon the types of thermal grease 32 used and the selected thermal grease's filling process) in the first embodiment heat spreader ball grid array (HSBGA) package 102. HSFCBGA (heat spreader flip chip ball grid array) has better heat-releasing properties than FCBGA but doesn't suffer higher stress which could damage LK dies. At present, PBGA could be used to assemble LK dies but HSBGA could not. However, HSBGA is required due to cost concern and heat-release.

Figure 2B:
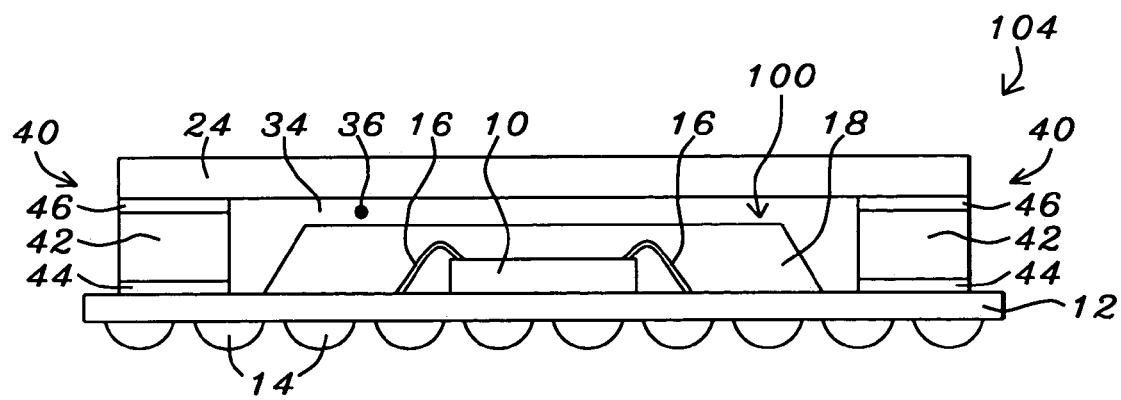
Figure 3A:
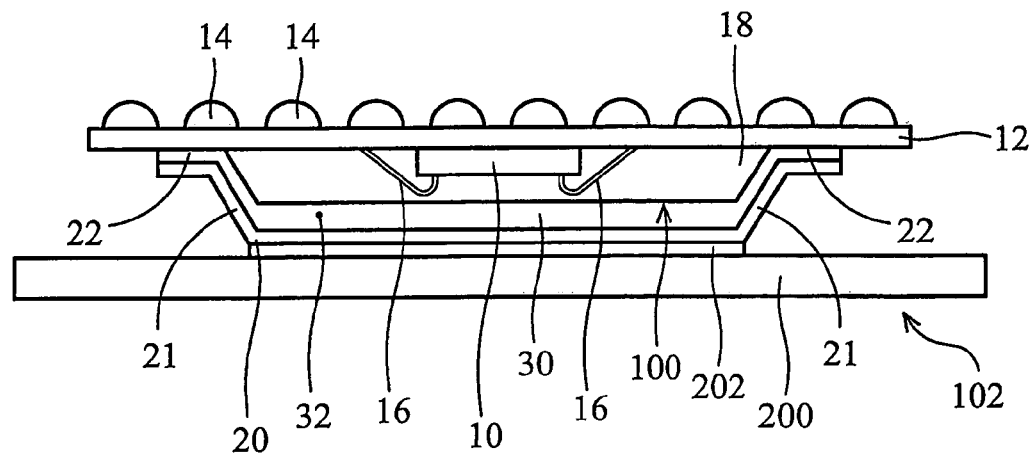
Figure 3B:
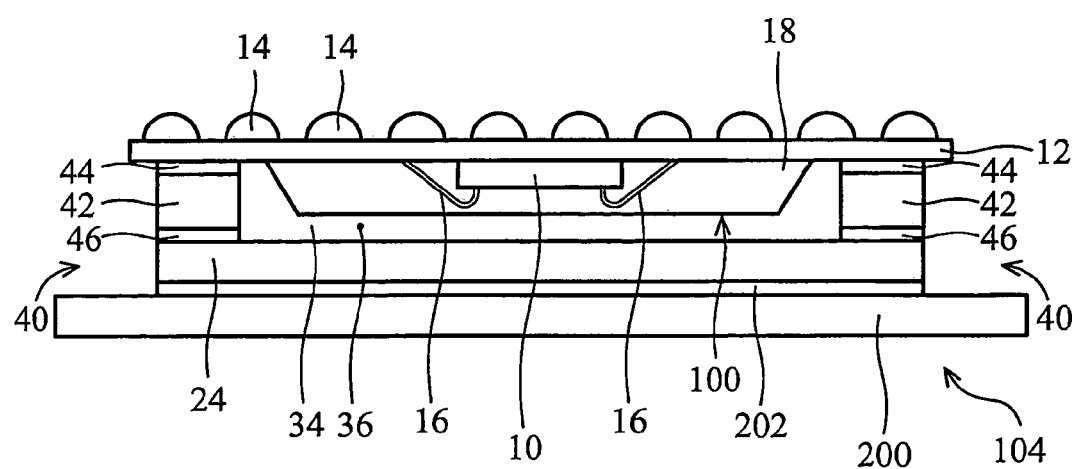

Formation of the Second Preferred HSBGA Package 104 in Accordance with the Present Invention—FIG. 2B FIG. 2B illustrates the formation of the heat spreader ball grid array (HSBGA) package 104 in accordance with the second preferred embodiment of the present invention.

Surrounding pillar 40 is formed around, and spaced apart from, ball grid array chip 100 (pillar 40 looks like a square ring). Pillar 40 comprises a stiffener portion 42 affixed to the substrate 12 as by epoxy adhesive 44. Stiffener portion 42 is preferably comprised of copper (Cu) (mainly) and aluminum (Al), chromium (Cr) plated on Cu, chromium plated on Al, nickel (Ni) plated on Cu, nickel plated on Al or other materials such as stainless steel and is more preferable copper (Cu).

Heat spreader 24 is affixed upon the upper end of pillar 40 as by epoxy adhesive 46 so that heat spreader 24 is over and above BGA chip 100 leaving a resultant gap 34 between the molding compound 18 that encases the semiconductor chip 10 and: (1) the pillar 40; and (2) the heat spreader 24.

Heat spreader 24 is preferably comprised of copper (Cu), aluminum (Al), chromium (Cr) plated on Cu, Cr plated on Al, nickel (Ni) plated on Cu, or Ni plated on Al and is more preferably Cu. The coefficient of thermal expansion (CTE) of the heat spreader 26 is preferably from about $10*10^{-6}$/K to $25*10^{-6}$/K depending upon the materials and is more preferably about $17*10^{-6}$/K for copper (Cu).

Further processing may then proceed. For example, heat spreader 24 may then be mounted onto a PCB substrate or stiffener 200 using an adhesive 202, as shown in 3B.

In an important aspect of the present invention, thermal grease 36 is inserted into the gap 34 at least between the heat spreader 24 and the molding compound 18. It is preferable that a portion of gap 34 remains once the thermal grease 36 is inserted to allow for the thermal grease 36 to expand to release stress.

It is also noted that it is possible to place the thermal grease over the molding compound 18 and then mounting the heat spreader 24.

Thermal grease 36 (also called thermal interface materials) is preferably a grease (silicon rubber) containing heat-conducting particles such as zinc oxide, aluminum oxide, aluminum nitride, boron nitride or ceramic fillers or other materials which have the properties of heat conduction.

The thermal grease 36 is thermally conductive and serves as a thermally conductive interface between the heat spreader 24 having a CTE of about $17*10^{-6}$/K, for example, and the molding compound 18 having a CTE of about $7*10^{-6}$/K, for example. This greatly reduces the thermal stress otherwise inherent and has been found to reduce cracking and delamination by up to from about 50 to 90% (depending upon the types of thermal grease 36 used and the selected thermal grease's filling process) in the second embodiment heat spreader ball grid array (HSBGA) package 104.

In both the first and second preferred HSBGA packages 102, 104 the thermal grease 32, 36 acts as a buffer to release the stress from the respective heat spreaders 20, 24 and transmits heat from the molding compound 18 to the heat spreaders 20, 24 so as to remove the heat from the silicon semiconductor chip 10/molding compound 18. The thermal grease 32, 36 must have high thermal conductivity, high viscosity and high elasticity.

Advantages of the Present Invention

The advantages of one or more embodiments of the present invention include:
1. its possible to apply HSBGA package types on LK dies;
2. lower stress impact on LK dies;
3. high thermally conductive performance;
4. lower cost of assembly than the use of present HSBGA processes;
5. the process and tools used to attach the heat spreader is the same as HSFCBGA (flip chip with heat spreader);
6. the process and tools for BGA is the same as general PBGA;
7. easier assembly process than the one of the present HSBGA processes; and
8. low requirement of the property of molding compound.

While particular embodiments of the present invention have been illustrated and described, it is not intended to limit the invention, except as defined by the following claims.

We claim:

1. A heat spreader ball grid array package, comprising:
a ball grid substrate;
a semiconductor chip affixed to the ball grid substrate;
a single molding compound without interfaces, encasing the semiconductor chip over the ball grid substrate;
a heat spreader mounted over the ball grid substrate and spaced apart from the molding compound to form a gap; and
thermal grease within the gap at least between the heat spreader and the molding compound, wherein the thermal grease comprises silicon rubber containing heat-conducting particles, the heat spreader has a shape of an inverted square pie tin having an elongated surrounding lip mounted over the ball grid substrate and the heat spreader has a surface exposed to a surrounding ambient, not contacting the mounding compound and the thermal grease.

2. The structure of claim 1, wherein the semiconductor chip is a silicon chip, a germanium semiconductor chip or a silicon germanium semiconductor chip.

3. The structure of claim 1, wherein the molding compound is selected from the group consisting of epoxy resin and a curing agent; and the heat spreader is selected from the group consisting of copper, aluminum, chromium plated on copper, chromium plated on aluminum, nickel plated on copper and nickel plated on aluminum.

4. The structure of claim 1, wherein the molding compound is comprised of epoxy resin; and the heat spreader is comprised of copper.

5. The structure of claim 1, wherein the silicon rubber containing heat-conducting particles are selected from the group consisting of zinc oxide, aluminum oxide, aluminum nitride, boron nitride or ceramic fillers which have the properties of heat conduction.

6. The structure of claim 1, wherein the molding compound is selected from the group consisting of epoxy resin, curing agent, a catalyst and a coupling agent.

7. The structure of claim 1, wherein the molding compound has coefficient of thermal expansion of from about $5*10^{-6}$/K to $15*10^{-6}$/K; and the heat spreader has a coefficient of thermal expansion of from about $10*10^{-6}$/K to $25*10^{-6}$/K.

8. The structure of claim 1, wherein the molding compound has coefficient of thermal expansion of about $7*10^{-6}$/K; and the heat spreader has a coefficient of thermal expansion of $17*10^{-6}$/K.

9. The structure of claim 1, wherein the semiconductor chip is a silicon chip and has a coefficient of thermal expansion of from about $2.5*10^{-6}$/K to $3.5*10^{-6}$/K.

10. The structure of claim 1, wherein the heat spreader being mounted onto the ball grid substrate at the elongated surrounding lip using epoxy adhesive.

11. The structure of claim 1, wherein the thermal grease nearly fills the gap.

12. The structure of claim 1, further including a pillar formed onto the ball grid substrate outboard of the semiconductor chip and the molding compound; wherein the heat spreader is mounted to the pillar.

13. The structure of claim 1, further including a pillar formed onto the ball grid substrate outboard of the semiconductor chip and the molding compound; the pillar including a stiffer portion; wherein the heat spreader is mounted to the pillar.

14. The structure of claim 1, further including a pillar formed onto the ball grid substrate outboard of the semiconductor chip and the molding compound; the pillar including a copper stiffener portion; wherein the heat spreader is mounted to the pillar.

15. The structure of claim 1, wherein the heat spreader comprises a tilted sidewall connected with the elongated surrounding lip.

16. A heat spreader ball grid array package, comprising:
a ball grid substrate;
a semiconductor chip affixed to the ball grid substrate;
a single molding compound without interfaces, encasing the semiconductor chip over the ball grid substrate;

thermal grease over the molding compound, wherein the thermal grease comprises silicon rubber containing heat-conducting particles;

a heat spreader mounted over the ball grid substrate, the molding compound and the thermal grease; and a PCB substrate or a stiffener mounted to the heat spreader, wherein the heat spreader has a shape of an inverted square pie tin having an elongated surrounding lip mounted over the ball grid substrate, and the heat spreader has a sidewall surface exposed to a surrounding ambient, not contacting the mounding compound and the thermal grease.

17. The structure of claim 16, wherein the semiconductor chip is a silicon chip, a germanium semiconductor chip or a silicon germanium semiconductor chip.

18. The structure of claim 16, wherein the molding compound is selected from the group consisting of epoxy resin and a curing agent; and the heat spreader is selected from the group consisting of copper, aluminum, chromium plated on copper, chromium plated on aluminum, nickel plated on copper and nickel plated on aluminum.

19. The structure of claim 16, wherein the molding compound is comprised of epoxy resin; and the heat spreader is comprised of copper.

20. The structure of claim 16, wherein the silicon rubber containing heat-conducting particles are selected from the group consisting of zinc oxide, aluminum oxide, aluminum nitride, boron nitride or ceramic fillers which have the properties of heat conduction.

21. The structure of claim 16, wherein the molding compound is selected from the group consisting of epoxy resin, curing agent, a catalyst and a coupling agent.

22. The structure of claim 16, wherein the molding compound has coefficient of thermal expansion of from about $5*10^{-6}$/K to $15*10^{-6}$/K; and the heat spreader has a coefficient of thermal expansion of from about $10*10^{-6}$/K to $25*10^{-6}$/K.

23. The structure of claim 16, wherein the molding compound has coefficient of thermal expansion of about $7*10^{-6}$/K; and the heat spreader has a coefficient of thermal expansion of $17*10^{-6}$/K.

24. The structure of claim 16, wherein the semiconductor chip is a silicon chip and has a coefficient of thermal expansion of from about $2.5*10^{-6}$/K to $3.5*10^{-6}$/K.

25. The structure of claim 16, wherein the heat spreader being amounted onto the ball grid substrate at the elongated surrounding lip using epoxy adhesive.

26. The structure of claim 16, wherein the thermal grease nearly fills the gap.

27. The structure of claim 16, further including a pillar formed onto the ball grid substrate outboard of the semiconductor chip and the molding compound; wherein the heat spreader is mounted to the pillar.

28. The structure of claim 16, further including a pillar formed onto the ball grid substrate outboard of the semiconductor chip and the molding compound; the pillar including a stiffener portion; wherein the heat spreader is mounted to the pillar.

29. The structure of claim 16, further including a pillar formed onto the ball grid substrate outboard of the semiconductor chip and the molding compound; the pillar including a copper stiffener portion; wherein the heat spreader is mounted to the pillar.

30. The structure of claim 16, wherein the sidewall surface is a tilted sidewall surface connected with the elongated surrounding lip.

* * * * *